(12) United States Patent
Doyle et al.

(10) Patent No.: US 10,937,807 B2
(45) Date of Patent: Mar. 2, 2021

(54) FERROELECTRIC FIELD-EFFECT TRANSISTOR DEVICES HAVING A TOP GATE AND A BOTTOM GATE

(71) Applicant: INTEL CORPORATION, Santa Clara, CA (US)

(72) Inventors: Brian S. Doyle, Portland, OR (US); Kaan Oguz, Beaverton, OR (US); Ricky J. Tseng, Portland, OR (US); Kevin P. O'Brien, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/465,044

(22) PCT Filed: Dec. 29, 2016

(86) PCT No.: PCT/US2016/069139
§ 371 (c)(1),
(2) Date: May 29, 2019

(87) PCT Pub. No.: WO2018/125122
PCT Pub. Date: Jul. 5, 2018

(65) Prior Publication Data
US 2019/0386014 A1 Dec. 19, 2019

(51) Int. Cl.
*H01L 27/115* (2017.01)
*H01L 29/66* (2006.01)
(Continued)

(52) U.S. Cl.
CPC .......... *H01L 27/1159* (2013.01); *G11C 5/063* (2013.01); *H01L 29/6684* (2013.01); *H01L 29/78391* (2014.09)

(58) Field of Classification Search
CPC .... H01L 27/11; H01L 27/115; H01L 27/1159; H01L 29/66; H01L 29/6684; H01L 29/78;
(Continued)

(56) References Cited

U.S. PATENT DOCUMENTS 6,370,056 B1    4/2002  Chen et al.
9,685,215 B1 *  6/2017  Kang .................. H01L 27/1159
(Continued)

FOREIGN PATENT DOCUMENTS

WO      2018125122 A1    7/2018

OTHER PUBLICATIONS

International Search Report and Written Opinion received for PCT/US2016/069139, dated Sep. 27, 2017. 17 pages.
(Continued)

*Primary Examiner* — Fazli Erdem
(74) *Attorney, Agent, or Firm* — Schwabe, Williamson & Wyatt, P.C.

(57) ABSTRACT

Techniques are disclosed for forming integrated circuit (IC) devices that include ferroelectric field-effect transistors (FE-FETs) having a top gate and a bottom gate (or, generally, a dual-gate configuration). The disclosed FE-FET devices may be formed in the back end of the IC structure and may be implemented with various materials that exhibit ferroelectric properties when processed at temperatures within the thermal budget of the back-end processing. The disclosed back-end FE-FET devices can achieve greater than two resistance states, depending on the direction of poling of the top and bottom gates, thereby enabling the formation of 3-state and 4-state memory devices, for example. Additionally, as will be appreciated in light of this disclosure, the disclosed back-end FE-FET devices can free up floor space in the front-end, thereby providing space for additional devices in the front-end.

20 Claims, 6 Drawing Sheets

(51) Int. Cl.
  *H01L 29/78* (2006.01)
  *H01L 27/1159* (2017.01)
  *G11C 5/06* (2006.01)

(58) Field of Classification Search
  CPC ............. H01L 29/78391; H01L 29/516; H01L 29/40111; G11C 5/063
  USPC ........................................................ 257/295
  See application file for complete search history.

(56) References Cited

U.S. PATENT DOCUMENTS

| | | |
|---|---|---|
| 2007/0145483 A1 | 6/2007 | Ono |
| 2007/0176218 A1* | 8/2007 | Kang ................. H01L 27/11502 257/295 |
| 2008/0203469 A1 | 8/2008 | Gruening-von Schwerin |
| 2009/0290404 A1 | 11/2009 | Kaneko et al. |
| 2010/0140589 A1* | 6/2010 | Ionescu ............... H01L 29/7391 257/24 |
| 2011/0299318 A1* | 12/2011 | Kaneko ................. H01L 29/516 365/145 |
| 2011/0309415 A1* | 12/2011 | Ng .................... H01L 29/78391 257/254 |
| 2012/0007158 A1 | 1/2012 | Yoon et al. |

OTHER PUBLICATIONS

International Preliminary Report on Patentability received for PCT/US2016/069139, dated Jul. 2, 2019. 8 pages.

Park, et al., "Evolution of phases and ferroelectric properties of thin Hf0.5Zr0.5O2 films according to the thickness and annealing temperature," Applied Physics Letters 102, (2013). pp. 242905-1 through 242905-5.

Usui, et al., "Polarization induced resistance switching effect in fenroelectric vinylidene-fluoride/trifluoroethylene copolymer ultrathin films," Applied Physics Letters 105, (2014). pp. 162911-1 through 162911-3.

* cited by examiner

FERROELECTRIC FIELD-EFFECT TRANSISTOR DEVICES HAVING A TOP GATE AND A BOTTOM GATE

BACKGROUND

A field-effect transistor (FET) is a semiconductor device that includes a gate, a source and a drain. A FET uses an electric field applied by the gate to control the electrical conductivity of a channel through which charge carriers (e.g., electrons or holes) flow from the source to the drain.

Figure 1:
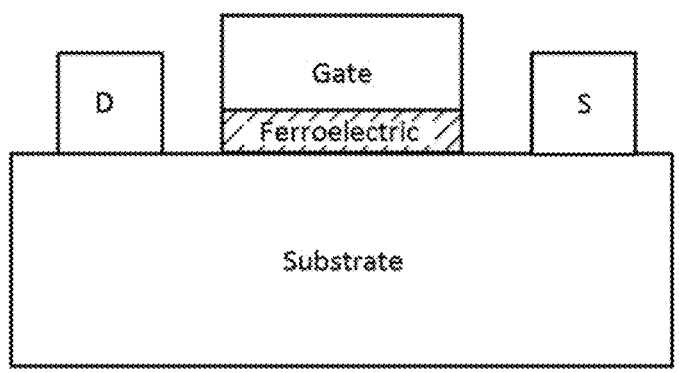
FIG. 1 illustrates a cross-section view of a front-end ferroelectric field-effect transistor (FE-FET) structure implemented with silicon semiconductor material.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Integrated circuit (IC) fabrication primarily includes two portions: the front-end or front-end-of-line (FEOL) and the back-end or back-end-of-line (BEOL). The front-end is formed during the first portion of IC fabrication and includes formation of individual semiconductor devices (e.g., logic transistors) and all processes up to deposition of metal interconnect layers. The front-end thus includes the device layer of the IC. The back-end is formed over the device layer during the second portion of IC fabrication when or more interconnect layers are produced (such as interconnect layers M1 through M9). In general, interconnect layers operatively connect the individual semiconductor devices of the device layer (the front-end) to contacts and other parts of the IC. The back-end may include any number of metallized layers, depending on target application or end use. As the back-end of an IC includes metallized materials, back-end processing temperatures are often constrained by the maximum temperature that the metallized materials present in the back-end can experience without degradation or other structural changes. This maximum temperature is sometimes referred to as the "thermal budget" of the back-end.

Techniques are disclosed for forming integrated circuit structures having ferroelectric field-effect transistor (FE-FET) structures that may be formed at processing temperatures within the thermal budget of the back-end. The disclosed FE-FET devices may be formed in the back-end of the integrated circuit (IC) (at some position above the device layer and/or a metallization line of the IC). As described herein, the disclosed FE-FET devices may include a semiconductor layer with a bottom gate positioned under the semiconductor layer and a top gate positioned above the semiconductor layer. The disclosed FE-FET devices also include a top ferroelectric layer between the semiconductor layer and the top gate and a bottom ferroelectric layer between the semiconductor layer and the bottom gate. Thus, the techniques described herein can be used to form a FE-FET device having a bottom gate and a top gate, which provides numerous advantages as will be apparent in light of this disclosure. For example, and in addition to other features, the disclosed FE-FET devices may be in one of several resistance states at any given time, depending on the direction of poling of the top and bottom gates of the device. For instance, in some cases, the disclosed FE-FET devices may provide a 3-state memory and, in some cases, a 4-state memory.

As can be understood based on this disclosure, FE-FETs including a single gate can be set to either a low state (e.g., a "0" state) or a high state (e.g., a "1" state) based on the poling of the gate of the FE-FET device (which determines the resistance state, for example). For instance, a FE-FET device may be poled (e.g., have its polarization set) by applying relatively large voltages to the gate of the FE-FET device (e.g., as compared to the read voltage), such as applying a large positive voltage (e.g., 1 V) to set the polarization state of the FE-FET to either a low or a high state and applying a large negative voltage (e.g., −1 V) to set the polarization state of the FE-FET to the other of a low or a high state, depending on the configuration of the device. Further, the state of the memory can be read by applying, for example, 0 V on the gate of the FE-FET device and reading whether the device outputs a relatively high current (e.g., a "1") or a relatively low current (e.g., a "0"), for example. However, by employing a dual-gate configuration (e.g., utilizing a top gate and a bottom gate) for a given FE-FET device, a larger number of memory states can be achieved as compared to a single gate FE-FET device, as can be understood based on this disclosure. For example, a 3-state memory FE-FET device as described herein provides three possible states for the FE-FET device, in accordance with some embodiments. Specifically, the possible resistance states for such a 3-state memory FE-FET may be as follows: a first state (e.g., a "0") when the top gate and bottom gate are each set to low resistance states; a second state (e.g., a "1") when either the top gate or the bottom gate is set to a high resistance state and the other of the top gate or the bottom gate is set to a low resistance state; and a third state (e.g., a "2") when the top gate and the bottom gate are each set to a high resistance state.

In a FE-FET device having a top gate and a bottom gate capable of a 4-state memory, four resistance states are possible. Namely, a first state (e.g., a "0") when both the top gate and the bottom gate are each set to low resistance states; a second state (e.g., a "1x") when the top gate is set to a high resistance state and the bottom gate is set to a low resistance state; a third state (e.g. a "1y") when the top gate is set to a low resistance state and the bottom gate is set to a high resistance state; and a fourth state (e.g. a "2") when both the top gate and the bottom gate are set to a high resistance state.

In embodiments where a 3-state memory is desired, a FE-FET device as described herein may be formed using the same or similar materials to form the top gate and the bottom gate and the same or similar materials to form the top and bottom ferroelectric layers. A FE-FET device having a 4-state memory may be formed using numerous techniques. For example, in some embodiments, the top ferroelectric layer and the bottom ferroelectric layer of the FE-FET device may be implemented with materials having unequal polarization voltages. In some such embodiments, the material of the top ferroelectric layer and the material of the bottom ferroelectric layer may have a polarization voltage difference of at least 25%, 50%, 75%, 100%, 125%, 150%, or more. In other embodiments, 4-state memory may be achieved by varying the thicknesses of the top ferroelectric layer and the bottom ferroelectric layer. For example, in some embodiments, the top ferroelectric layer may have a thickness that differs from the thickness of the bottom ferroelectric layer by at least 5 nm, 10 nm, 15 nm, 20 nm, 25 nm, 30 nm, 35 nm, 40 nm, 45 nm, 50 nm, or more. In these or other embodiments, the top gate and bottom gate may be implemented with materials having unequal work functions. For example, the work function of the material used to form the top gate and the work function of the material used to form the bottom gate may differ by at least 0.4 eV, 0.6 eV, 0.8 eV, 1.0 eV, 1.2 eV, 1.4 eV, 1.6 eV, 1.8 eV, 2.0 eV, or more, in some embodiments.

The semiconductor substrate of the disclosed FE-FET devices may be formed at a temperature within the thermal budget of the back-end and may, in some cases, be implemented with a material having a crystal structure that is not monocrystalline. For example, in some cases, the semiconductor substrate of the disclosed FE-FET devices is formed of polycrystalline or amorphous silicon. In other embodiments, the semiconductor substrate of an example FE-FET device is formed of indium gallium zinc oxide (IGZO), a group III-V material, indium tin oxide (ITO), a complex oxide, or a transition metal dichalcogenide. As previous stated, the disclosed FE-EFT devices having both a top gate and a bottom gate also include a first ferroelectric layer between the semiconductor substrate and the bottom gate and a second ferroelectric layer between the semiconductor substrate and the top gate. The first and second ferroelectric layers may be implemented with materials that exhibit ferroelectric properties when deposited, annealed, or otherwise processed at temperatures within the thermal budget of the back-end. For example, the ferroelectric material of example FE-FET devices as described herein may exhibit ferroelectric properties at processing temperatures of less than 500° C., 400° C., less than 300° C., or less than 200° C., in some embodiments. In some particular embodiments, the ferroelectric layers of the disclosed FE-FET devices may be implemented with a transition metal oxide or one more transition metal oxides, such as an alloy of hafnium oxide and zirconium oxide. In some cases where the ferroelectric material of the FE-FET device is an alloy of hafnium oxide and zirconium oxide, the alloy may include approximately equal atomic percentages of hafnium oxide and zirconium oxide while in other cases, the atomic percentages of hafnium oxide and zirconium oxide may be unequal, with either a greater amount of hafnium oxide or zirconium oxide present.

In addition to providing a 3-state or a 4-state memory, the disclosed FE-FET devices may also provide numerous benefits as compared to other FE-FET devices (that are located in the front-end). For example, a FE-FET device located in the back-end of a device as opposed to the front-end of the device provides for increased space in the front-end that may be utilized for additional devices. Additionally, techniques are described for stacking two or more back-end FE-FET devices on top of one another, thereby doubling or, in some cases, tripling or quadrupling the cell count. The techniques variously described herein can thus provide increased cell density and versatility for implementation. Numerous other configurations and variations will be apparent in light of this disclosure.

General Overview

As previously described, IC fabrication customarily includes two portions: the front-end or front-end-of-line (FEOL) and the back-end or back-end-of-line (BEOL). A distinguishing factor between the front-end and back-end portions of an IC is that back-end processing generally begins when individual devices formed during front-end processing become interconnected or otherwise routed for a circuit with wiring or other electrical conductors. Interconnect features of the back-end are generally formed of one or more metallized layers, each layer having one or more metal conductors including vias and lines within a dielectric layer or structure. Some interconnect layers may include both metal conductors and dielectric material, while others may include only dielectric material or only metal. As the interconnect features of the back-end are sometimes implemented with metal, back-end processing can have a relatively low or limited thermal budget (e.g., the back-end processing temperature may be limited to less than 500° C., less than 475° C., less than 450° C., less than 425° C., less than 400° C., less than 350° C., or less than 300° C.).

Ferroelectrics are dielectric materials that show spontaneous electric polarization. When an external electric field is applied to a ferroelectric, the direction of polarization may be altered. When used in a transistor, ferroelectrics can provide both memory and logic functions. For example, in ferroelectric field-effect transistors (FE-FETs), the direction of spontaneous polarization can used to store information by either switching or not switching polarization direction when a voltage is applied to the gate of the transistor, to signify either a "0" or a "1."

Many ferroelectric materials require processing temperatures above the thermal budget of the back-end. Accordingly, ferroelectric field-effect transistors (FE-FETs) are conventionally formed during front-end processing. FIG. 1 illustrates the structure of an example front-end FE-FET device formed on a crystalline silicon semiconductor substrate, where silicon is used as the channel. Such conventional FE-FET devices formed during front-end processing occupy valuable IC floor space that could be used for housing additional devices. It would thus be highly advantageous to include FE-FET devices in the back-end to provide space for additional logic and/or memory features in the front-end, thereby increasing the density and functionality of the chip. Additionally, FE-FET devices that include both a top gate and a bottom gate are valuable as the device may be capable of being in greater than two resistance states, depending on the direction of poling of the top and bottom gates of the device. In particular, as described in detail herein, there are several different values of resistance possible for a device having a top gate and a bottom gate.

Back-end FE-FET devices have not previously been built, at least in part, due to difficulties in fabricating the ferroelectric material at temperatures within the thermal budget of the back-end processing (e.g., temperatures less than 400, 450, or 500° C.). Ferroelectric materials conventionally used for forming FE-FET devices, such as lead zirconate titanate (PZT), barium titanium oxide (BTO) and barium strontium titanate (BST), require deposition temperatures of approximately 700° C. to effectively form, which is far above the thermal budget of typical back-end processing. Other ferroelectric materials that may be deposited at lower temperatures, such as doped hafnium oxide ($HfO_2$), doped or undoped strontium (Sr), aluminum (Al), silicon (Si) and yttrium (Y), for example, generally require annealing temperatures above 600° C. to change from insulator material to ferroelectric material. The processing temperatures of these materials are thus also above the back-end thermal budget for typical IC processing. Similarly, processing temperature restrictions have prevented FE-FET devices having both a top gate and a bottom gate (or otherwise having a dual-gate configuration) from being formed.

In contrast, and in accordance with embodiments of the present disclosure, a FE-FET device is configured with a top gate and bottom gate along with ferroelectric material that exhibits ferroelectric properties when processed at temperatures within the thermal budget of the back-end. In accordance with these and other embodiments of the subject disclosure, one or more FE-FET devices may be formed during back-end processing of integrated circuit (IC) structures. The disclosed back-end FE-FET devices may be able to provide comparable or improved ferroelectric performance relative to FE-FET devices formed during front-end processing. Additionally, as will be further appreciated in light of this disclosure, the disclosed back-end FE-FET devices may also free up valuable IC floor space in the front-end location of the IC (e.g., the conventional device layer of the IC), thereby providing space for additional devices at those front-end locations. Moreover, the disclosed FE-FET devices may provide a 3-state memory or, in some cases, a 4-state memory.

From a structural viewpoint, integrated circuit (IC) structures that include the disclosed FE-FET devices as provided herein may include various cross-section profiles. For example, in some embodiments, a semiconductor substrate may be formed in the back-end of the IC structure, for example, on or over a metallized line (e.g., a via) of the device. The semiconductor substrate of the disclosed back-end FE-FET devices, may, in some cases, be formed of polycrystalline or amorphous silicon. In some particular embodiments, one or more FE-FET devices may be positioned on or over another FE-FET device in the back-end. Generally, any number of dual-gate FE-FET devices may be formed in the back-end of an IC using the techniques described herein. Numerous configurations and variations will be apparent in light of the subject disclosure. As will be apparent, the disclosed techniques may, in some embodiments, provide additional floor space in the front-end of a device and may, in some cases, provide increased memory density of the device.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, or high resolution physical or chemical analysis, to name some suitable example analytical tools may also be used to detect the techniques and structures provided herein. In some embodiments, for instance, a SEM may indicate a FE-FET device having a top gate and a bottom gate. In some cases, chemical analysis of the ferroelectric material of the FE-FET device may also reveal that a particular IC structure includes a FE-FET device, as presently described.

The semiconductor structures variously described herein may be suitable for numerous applications, such as for personal computers (PC), tablet computers, smartphones, test equipment, power management and communication applications, as well as power conversion and automotive applications, to name a few examples. The structure may be included in an integrated circuit chip or chip set, such as a system-on-chip (SOC). Numerous configurations and variations will be apparent in light of this disclosure.

Architecture and Methodology

Figure 2:
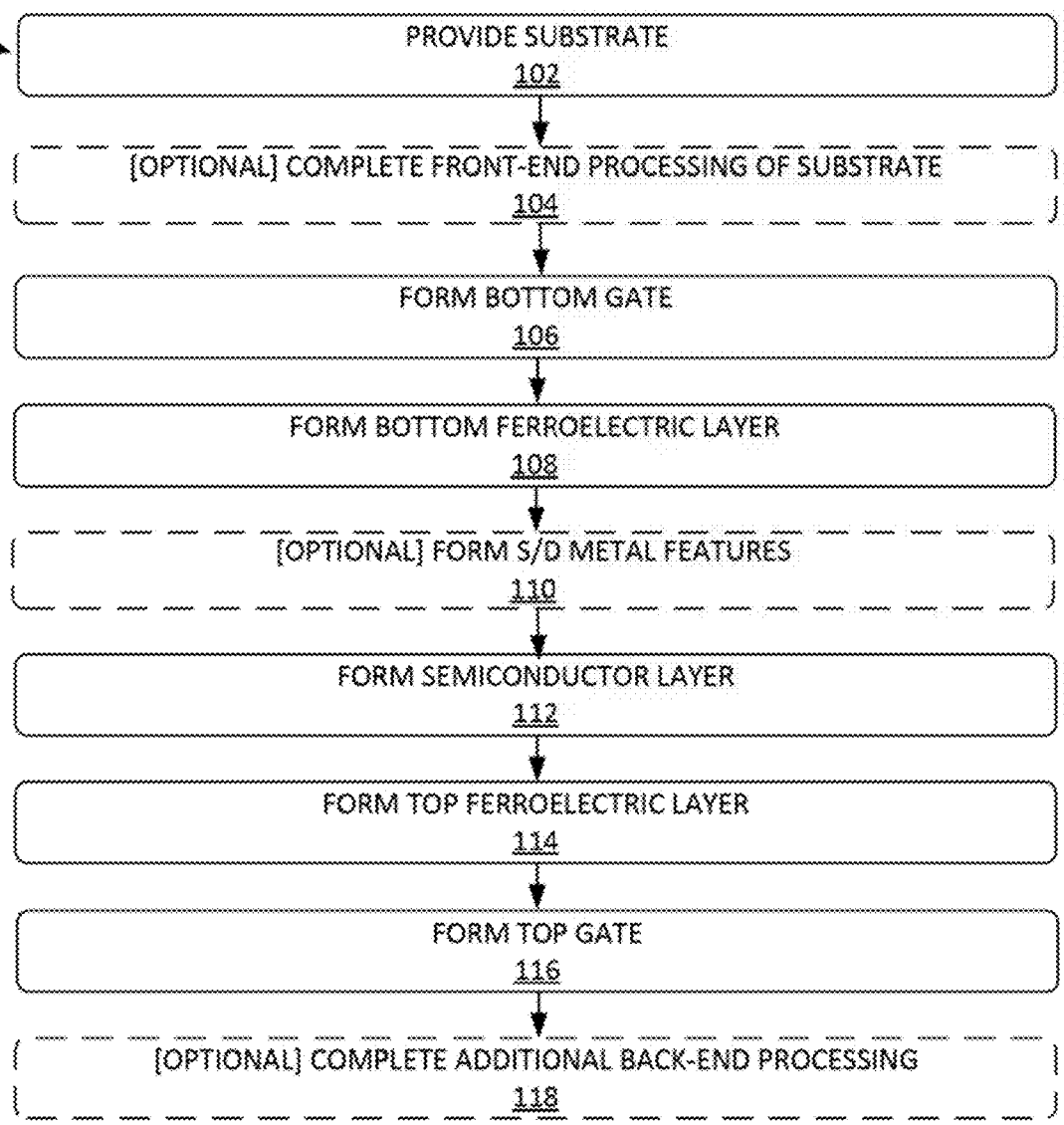
FIG. 2 illustrates an example methodology for producing FE-FET devices that include a bottom gate and a top gate, in accordance with one or more embodiments of the present disclosure.

FIG. 2 illustrates a method 100 of forming integrated circuit (IC) structures including FE-FET devices having a top gate and a bottom gate, in accordance with one or more embodiments of the present disclosure. FIGS. 3A-3F illustrate example structures that may be formed when carrying out method 100 of FIG. 2, in accordance with some embodiments. As will be appreciated in light of this disclosure, the disclosed techniques may be used to form various types of FE-FET devices, depending on end use or target application.

As shown in FIG. 2, method 100 includes providing 102 a substrate 200, in accordance with an example embodiment. Substrate 200 may be formed of any suitable semiconductor material, including group IV semiconductor materials such as silicon (Si), silicon carbide (SiC), sapphire, germanium (Ge), or silicon germanium (SiGe). In some embodiments, the substrate may be an X on insulator (XOI) structure where X includes Si, Ge, SiC, SiGe, or sapphire, and the insulator material may be an oxide material, a dielectric material, some other electrically insulating material, or a multilayer structure where the top layer includes Si, Ge, SiC, SiGe, or sapphire. In some embodiments where substrate 200 is implemented with silicon, the silicon may be single crystal silicon and in some cases may be prepared to expose a particular plane of its crystal structure as defined by a Miller index number. For example, in some embodiments, substrate 200 may include Si 111, Si 110, Si 100 with an offcut of between 2 to 8 degrees toward 110, or equivalents thereof. Substrate 200 may have any suitable thickness, such as a thickness in the range of 100 to 950 microns, in the case of a bulk substrate.

Figure 3A:
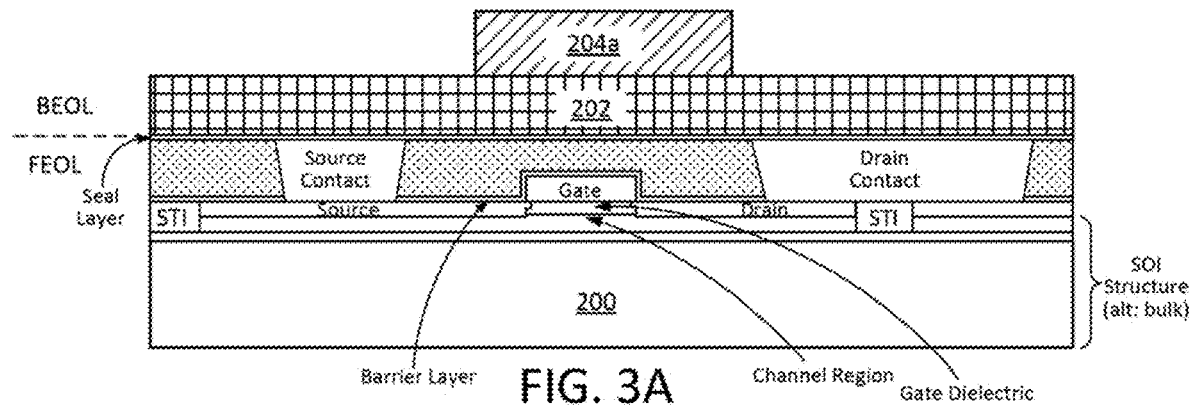
FIGS. 3A-3F illustrate example integrated circuit structures that may be formed when carrying out the method of FIG. 2, in accordance with various embodiments of the present disclosure.

Method 100 of FIG. 2 continues with optionally completing 104 front-end processing of the substrate 200. Completing 104 front-end processing can include various features, such as wafer preparation, isolation, well formation, gate patterning, spacer formation, extension, source and drain (S/D) implantation, silicide formation, dual stress liner formation, and/or forming any desired integrated circuit structures on substrate 200 using any appropriate lithography technique. In some embodiments, completing 104 front-end processing can include forming one or more transistors, capacitors, and/or resistors, etc. An example IC that includes both front-end-of-line (FEOL) and back-end-of-line (BEOL) regions is shown in FIG. 3A. As shown in FIG. 3A, the example FEOL region includes a logic transistor having a source, drain, gate and gate dielectric (e.g., a high-k gate dielectric), among other possible features. Although FIG. 3A illustrates a SOI structure, in other embodiments, a bulk substrate may be used. The FEOL region of the disclosed IC structures may also include any other device or structure. Although contact features of the devices shown in the FEOL region are positioned in the FEOL region of FIG. 3A, it is to be understood that these contact features may, in some embodiments, be formed during BEOL processing or processing that occurs between FEOL processing and BEOL processing, sometimes referred to as middle-of-the-line (MOL) processing. As shown in FIG. 3A and in accordance with some embodiments, a seal layer (for example, comprising silicon carbide, SiC) may be formed to isolate desired components of the front-end. Throughout the subject disclosure, the FEOL and BEOL processing and/or locations may each be referred to simply as "front-end" and "back-end," respectively, for ease of discussion.

Method 100 of FIG. 2 continues with forming 106 bottom gate 204a to produce a structure as shown in FIG. 3A, in accordance with an example embodiment. Bottom gate 204a may be implemented with any appropriate material, including titanium nitride (TiN), polysilicon, silicon nitride, silicon carbide, or various suitable metals or metal alloys, such as aluminum (Al), tungsten (W), titanium (Ti), tantalum (Ta), copper (Cu), or tantalum nitride, for example. As shown in FIG. 3A, bottom gate 204a is surrounded by inter layer dielectric (ILD) material 202. If present, ILD material 202 may be implemented with any dielectric material, including various oxides, such as silicon dioxide, silicon nitride, or other spin-on dielectrics. ILD material 202 may have any desired thickness, such as less than 300 nm, less than 200 nm, less than 150 nm, or less than 100 nm, in accordance with some example embodiments. Any suitable deposition technique may be used to deposit ILD material 202 and/or bottom gate 204a, including chemical vapor deposition (CVD), atomic layer deposition (ALD), physical vapor deposition (PVD), or any other appropriate process.

Figure 3B:
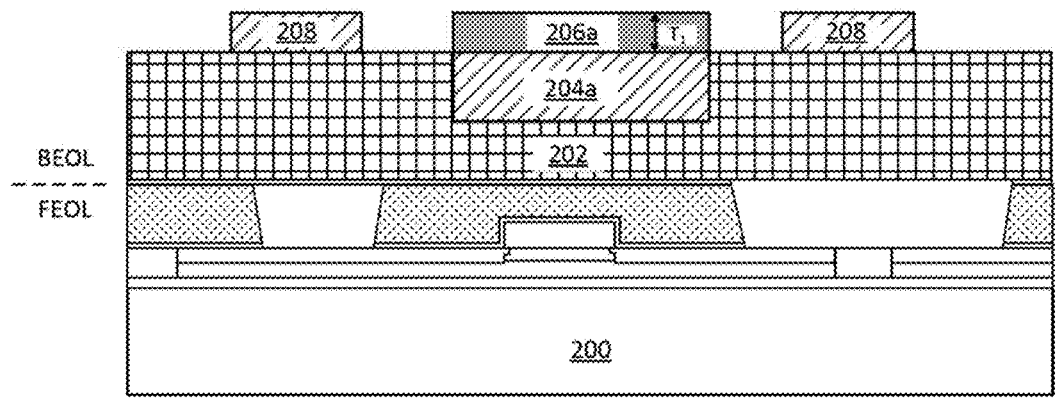

Method 100 of FIG. 2 continues with forming 108 a bottom ferroelectric layer 206a to produce a structure as shown in FIG. 3B, in accordance with some example embodiments. Bottom ferroelectric layer 206a may be formed of any material that exhibits ferroelectric properties. In some embodiments, bottom ferroelectric layer 206a includes a ferroelectric material that may be deposited and/or annealed at temperatures within the thermal budget of the back-end. For example, in some particular embodiments, the ferroelectric material of bottom ferroelectric layer 206a may exhibit ferroelectric properties after processing (e.g., deposition and/or annealing) at a temperature of less than 500° C., 475° C., 450° C., 425° C., 400° C., 375° C., 350° C., 325° C., 300° C., 275° C., 250° C., 225° C., or 200° C. In some particular embodiments, the ferroelectric material of ferroelectric layer 208 may exhibit ferroelectric properties when processed at a temperature less than 400° C. but above 200° C.

Bottom ferroelectric layer 206a may include, in some embodiments, one or more doped or undoped transition metal oxides. For example, in some embodiments, bottom ferroelectric layer 206a may include doped or undoped hafnium oxide ($HfO_2$) or zirconium oxide ($ZrO_2$). Ferroelectric layer 208 may, in some embodiments, include an alloy of at least two transition metal oxides. For example, in some particular example embodiments, bottom ferroelectric layer 206a may be implemented with an alloy of hafnium oxide and zirconium oxide ($HfO_2/ZrO_2$). In some specific embodiments, bottom ferroelectric layer 206a may include an alloy having approximately equal atomic percentages of $HfO_2$ and $ZrO_2$. In other embodiments, however, bottom ferroelectric layer 206a may include an alloy of $HfO_2$ and $ZrO_2$ in atomic percentage ratios ranging from between 1:2 to 2:1 $HfO_2$ to $ZrO_2$. In various embodiments, ferroelectric layer 208 may include hafnium zirconium oxide ($Hf_{0.5}Zr_{0.5}O_2$). In embodiments where bottom ferroelectric layer 206a includes one or more dopants, the total weight percentage of dopants used may be less than 10%, less than 8%, less than 5%, less than 4%, less than 3%, less than 2% or less than 1% of the weight of the ferroelectric layer. In embodiments where bottom ferroelectric layer 206a includes one or more dopants, any suitable type of dopant may be used, such as aluminum, silicon, yttrium, gadolinium, lanthanum, boron, gallium, indium, and/or tin, in some example embodiments. Numerous configurations and variations will be apparent to one of skill in the art.

The thickness of bottom ferroelectric layer 206a may vary based on the end use or desired application. The thickness of bottom ferroelectric layer 206a, $T_1$, is shown in FIG. 3B. In some embodiments, bottom ferroelectric layer 206a may have a thickness ($T_1$) of between 1 nm and 100 nm. Bottom ferroelectric layer 206a may be deposited by any appropriate deposition process, such as by atomic layer deposition (ALD) or by physical vapor deposition (PVD). In some embodiments, for example, where bottom ferroelectric layer 206a is formed by PVD, the ferroelectric material may optionally be re-annealed after deposition.

Method 100 of FIG. 2 continues with optionally forming 110 source and drain (S/D) metal features 208 to produce a structure as shown in FIG. 3B, in accordance with some example embodiments. S/D metal features 208 may, in some embodiments, include a metal layer that contacts a desired electrically conducting feature, such as, for example, a bitline, and/or via. However, in other examples, S/D metal feature 208 may itself be a bitline and/or via. Although as shown in FIGS. 3B-3F, S/D metal features 208 are positioned underneath a semiconductor layer, it is to be understood that in some embodiments S/D metal features 208 may alternatively be positioned above a semiconductor layer, as described with respect to FIG. 4B. S/D metal feature(s) 208 may be formed using, for example, a silicidation process (generally, deposition of contact metal and subsequent annealing). Example materials that may be used to form S/D metal features 208 include but are not limited to titanium, titanium nitride, aluminum, tungsten, titanium, tantalum, copper, palladium, platinum, ruthenium, silver, gold, tantalum nitride (TaN), or various suitable metals or metal alloys, for example.

Figure 3C:
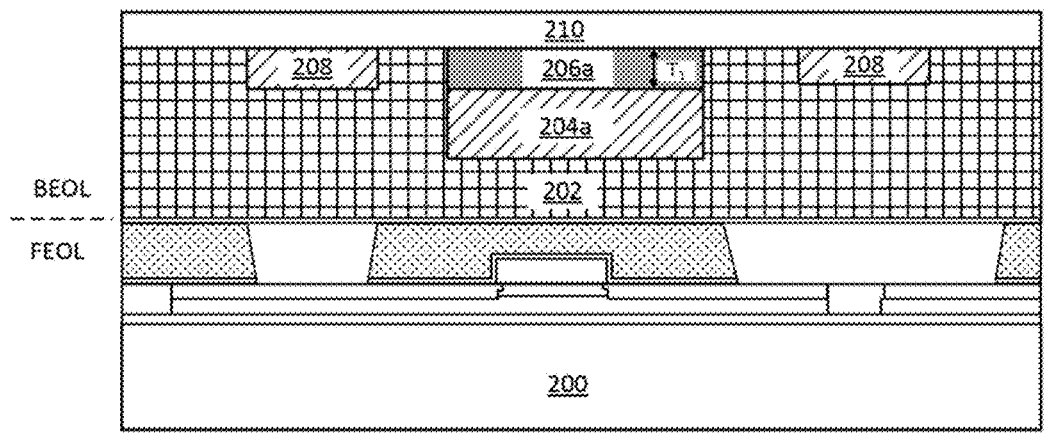

Method 100 of FIG. 2 continues with forming 212 a semiconductor layer 210 to produce a structure as shown in FIG. 3C, in accordance with some example embodiments. Semiconductor layer 210 may be implemented with any desired semiconductor material. In some embodiments, semiconductor layer 210 may include one or more of the following materials: silicon, such as polycrystalline silicon or amorphous silicon, indium gallium zinc oxide (IGZO), one or more group III-V materials, including group III material-nitride (III-N) compounds, such as low temperature poly III-V materials, including but not limited to indium tin oxide (ITO), complex oxides (chemical compounds containing oxygen and at least two other elements or containing oxygen and one other element that is in at least two oxidation states), and/or transition metal dichalcogenides (e.g., $MoS_2$, $WS_2$, $MoSe_2$, $WSe_2$, $MoTe_2$). Semiconductor layer 210 may have any desired thickness and in some embodiments semiconductor layer 210 has a thickness of less than, more than, or approximately 20 nm.

In some select embodiments, S/D regions of semiconductor layer 210 may be formed, if necessary. In various embodiments, semiconductor layer 210 does not include discrete S/D regions and instead operates as a type of Schottky barrier with S/D metal features 208 (e.g., metal contacts, bitlines, vias, or other metal structures) on semiconductor layer 210 forming the potential energy barrier for electrons or carriers. It should be noted that semiconductor layer 210 in FIG. 3C may be doped or undoped. In some embodiments, semiconductor layer 210 may be doped or undoped throughout or doped in one or more regions to form discrete S/D regions. In embodiments where at least a portion or all of semiconductor layer 210 is doped, semiconductor layer 210 may be doped by any appropriate process. For example, in some cases, semiconductor layer 210 may be exposed to chemicals, including dopants, through a chemical bath. In various embodiments, S/D regions may be formed in semiconductor layer 210 through ion implantation. In some embodiments where semiconductor layer 210 includes discrete S/D regions, the S/D regions may be formed via molecular doping that does not exceed the back-end thermal budget (such as a thermal budget of 400° C.). In some cases, molecular doping processes may involve adhering a self-assembled monolayer to the surface of semiconductor layer 210 and driving the dopant material into semiconductor layer 210 at desired locations via a relatively low temperature anneal to form S/D regions within semiconductor layer 210. In some embodiments, S/D regions may be formed by removing a portion of semiconductor layer 210 and replacing it with appropriate S/D material. If doped, S/D regions may be p-type doped or n-type doped using any suitable dopant. Material used to form S/D regions may be doped prior to deposition, during deposition (in situ), or after deposition (ion implantation) to provide the desired polarity of p-type or n-type, in some particular embodiments. The doping may be graded within the deposited S/D material, in some embodiments. In some specific embodiments, semiconductor layer 210 is implemented with polycrystalline or amorphous silicon and the S/D material of the S/D regions may be, for example, silicon doped to form n-type S/D regions.

Figure 3D:
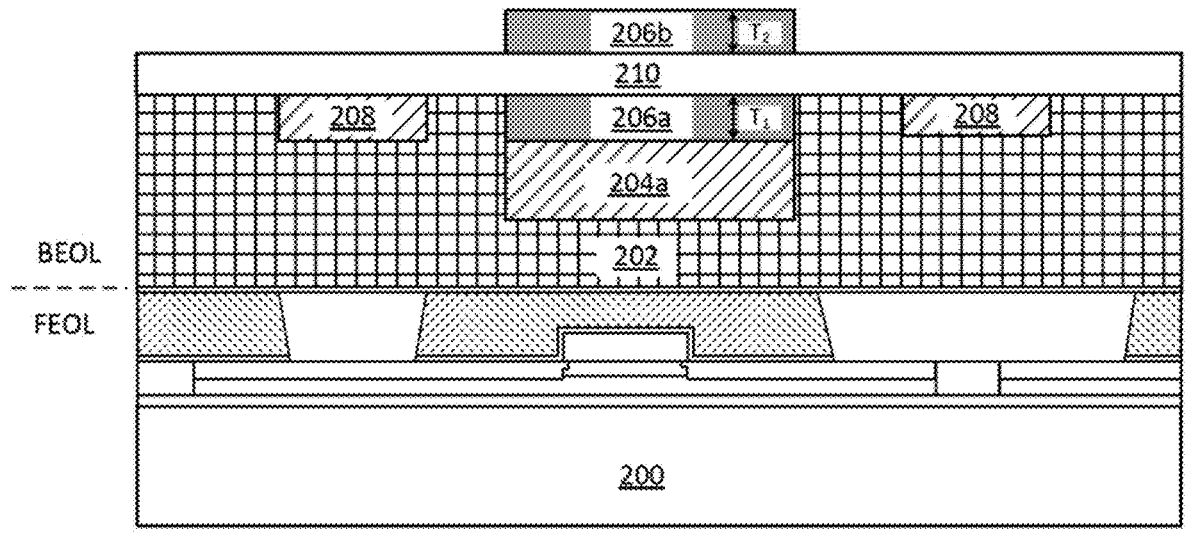

Method 100 of FIG. 2 continues with forming 114 a top ferroelectric layer 206b on semiconductor layer 210 to produce a structure as shown in FIG. 3D, in accordance with some example embodiments. Top ferroelectric layer 206b may be formed of any ferroelectric material as discussed with respect to bottom ferroelectric layer 206a. In some embodiments, top ferroelectric layer 206b and bottom ferroelectric layer 206a may be formed of the same ferroelectric material(s) or different ferroelectric material(s). In examples where top ferroelectric later 206b and bottom ferroelectric layer 206a are implemented using different ferroelectric materials, the material of the top ferroelectric layer and the material of the bottom ferroelectric layer may have unequal polarization voltages. In some such embodiments, the material of the top ferroelectric layer 206b and the material of the bottom ferroelectric layer 206a may have a polarization voltage difference of at least 25%, 50%, 75%, 100%, 125%, 150%, or more. For example, in an embodiment where the top ferroelectric layer has a polarization voltage of approximately 2V and the bottom ferroelectric layer has a polarization voltage of approximately 4V, the polarization voltage of the top ferroelectric layer is approximately 100% greater than the polarization voltage of the bottom ferroelectric layer. Numerous configurations and variations will be apparent.

Top ferroelectric layer 206b may have any desired thickness, such as a thickness of between 1 nm and 100 nm. FIG. 3D shows the thickness of top ferroelectric layer as $T_2$. In some embodiments, the thickness of top ferroelectric layer ($T_2$) is less than, greater than, or equal to the thickness of bottom ferroelectric layer ($T_1$). In embodiments where $T_1$ does not equal $T_2$, the top ferroelectric layer may have a thickness ($T_2$) that differs from the thickness of the bottom ferroelectric layer ($T_1$) by at least 5 nm, 10 nm, 15 nm, 20 nm, 25 nm, 30 nm, 35 nm, 40 nm, 45 nm, 50 nm, or more. In various example embodiments, top ferroelectric layer and/or bottom ferroelectric layer may have a thickness of less than 5 nm, less than 10 nm, less than 15 nm, less than 20 nm, less than 25 nm, or greater than 25 nm, in some embodiments. After deposition, top ferroelectric layer 206b may be selectively etched, as desired to remove excess ferroelectric material or to provide area(s) on the semiconductor layer 210 for S/D regions and/or S/D contacts to be formed, if desired. Top ferroelectric layer 206b may be etched, if desired, by any appropriate technique, including by one or more etching processes, and in some embodiments may include the use of buffered or unbuffered hydrofluoric acid (HF) and/or TriMix etchant. In some embodiments, the etch chemistry used to remove material of top ferroelectric layer 206b is selective to the ferroelectric material (it only removes the ferroelectric material and doesn't remove or otherwise only minimally removes) the other exposed materials.

Figure 3E:
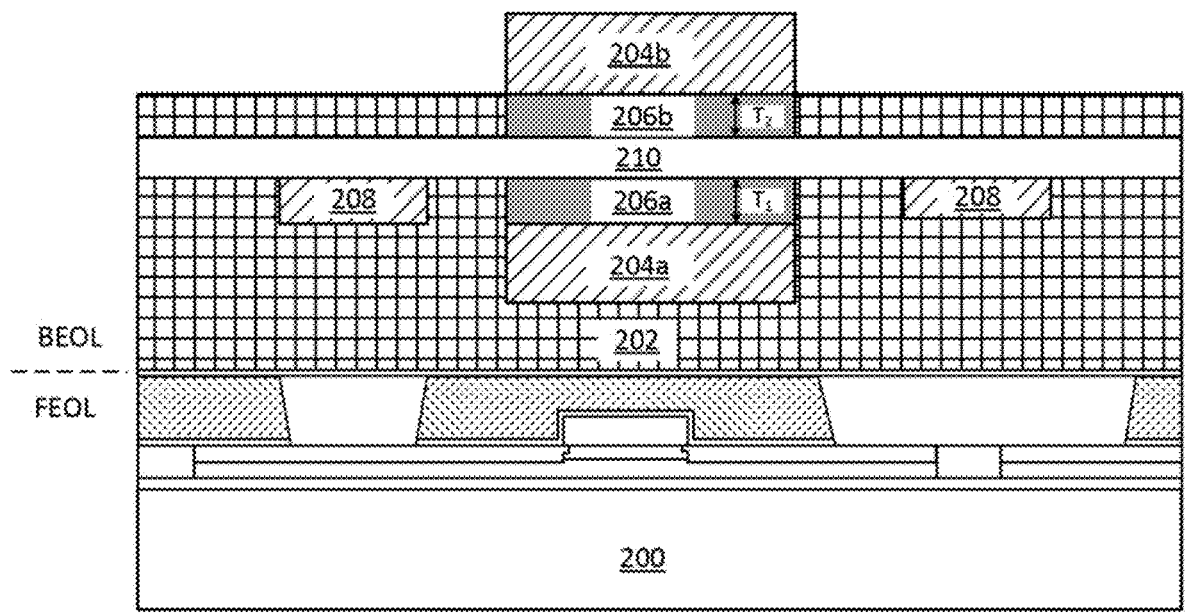

Method 100 of FIG. 2 continues with forming 116 top gate 204b on top ferroelectric layer 206b to produce a structure as shown in FIG. 3E, in accordance with some example embodiments. Top gate 204b may be formed of any appropriate material, including any of the materials described with respect to bottom gate 204a. In some embodiments, top gate 204b may be formed of the same material(s) as bottom gate 204a, while in other embodiments, different materials may be used to form top gate 204b and bottom gate 204a. In embodiments where top gate 204b and bottom gate 204a are implemented with different materials, the material used to form top gate and the material used to form bottom gate may have unequal work functions. For example, in some embodiments, the work function of the material used to form the top gate and the work function of the material used to form the bottom gate may differ by at least 0.4 eV, 0.6 eV, 0.8 eV, 1.0 eV, 1.2 eV, 1.4 eV, 1.6 eV, 1.8 eV, 2.0 eV, or more.

Figure 3F:
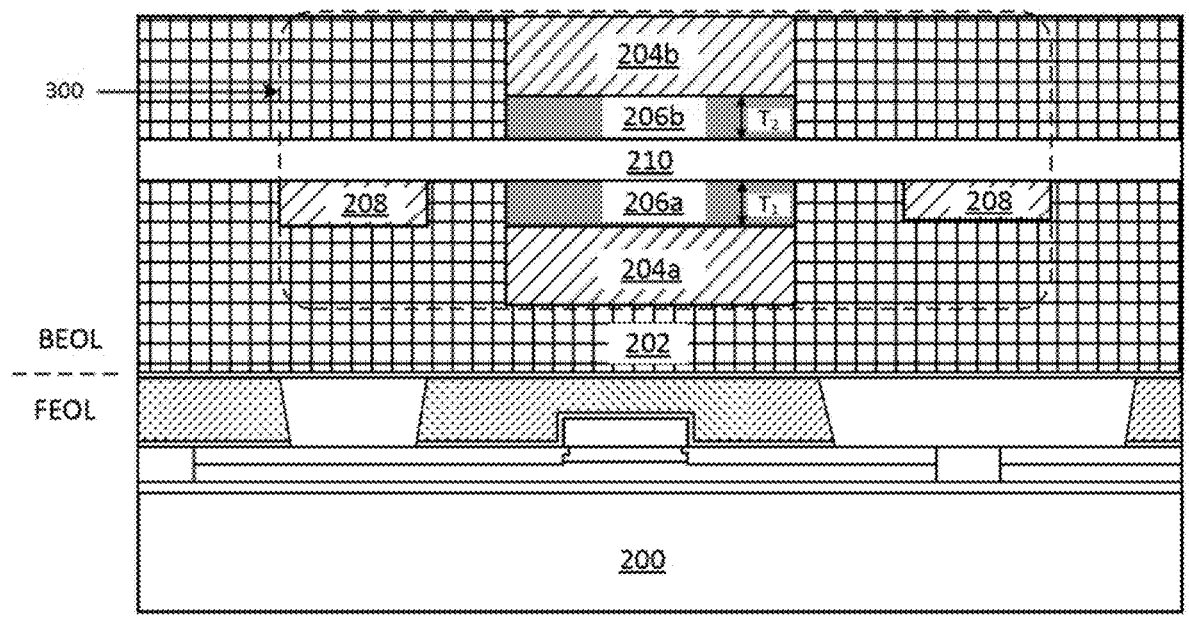

Method 100 of FIG. 2 continues with optionally completing 118 additional back-end processing, in accordance with some example embodiments. FIG. 3F shows an example FE-FET device 300. Although not shown in FIG. 3F, spacers may also be formed on either side of bottom gate 204a and/or top gate 204b, if desired. If present, spacers may be formed of any suitable spacer material, including silicon nitride or silicon dioxide, or any other gate spacer material. It will be understood that although depicted linearly in FIG. 3E, the components of the disclosed FE-FET device 300 (e.g., bottom gate 204a, bottom ferroelectric layer 206a, S/D contacts 208, substrate 210, top ferroelectric layer 206b and/or top gate 204b) may be non-linear, in some embodiments. In some embodiments, one or more additional structures may also be formed in the back-end of the IC during additional back-end processing. In some embodiments, additional back-end processing may include contact formation, formation of one or more wordlines or bitlines, and/or formation of additional FE-FET devices in the back-end of the device. Numerous variations on method 100 will be apparent in light of the present disclosure.

Additional Embodiments

Figure 4A:
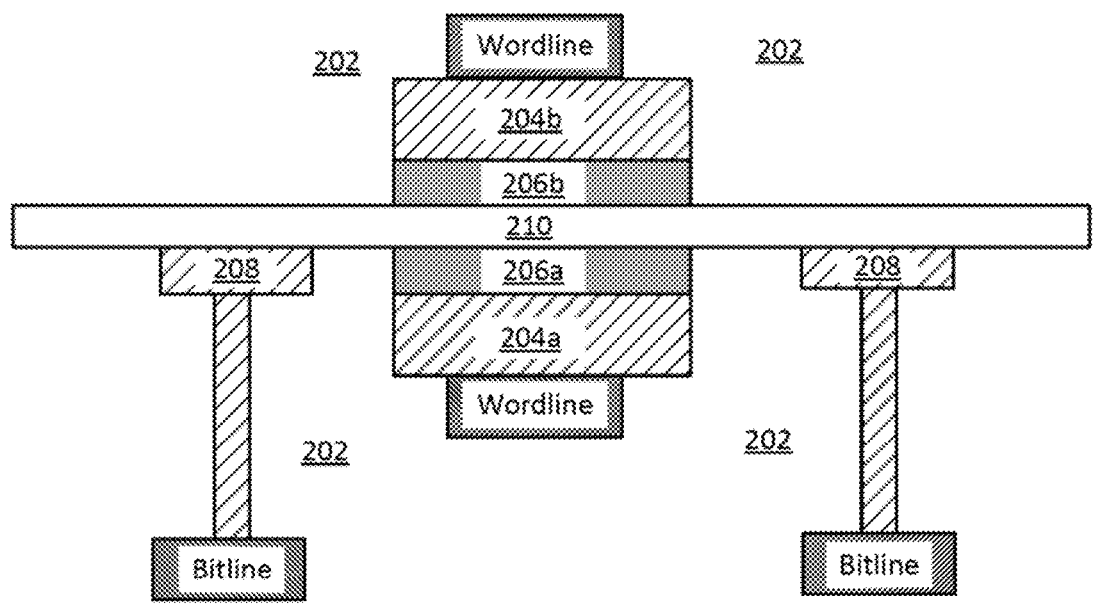
FIGS. 4A and 4B illustrate example FE-FET device configurations, in accordance with one or more embodiments of the present disclosure.
Figure 4B:
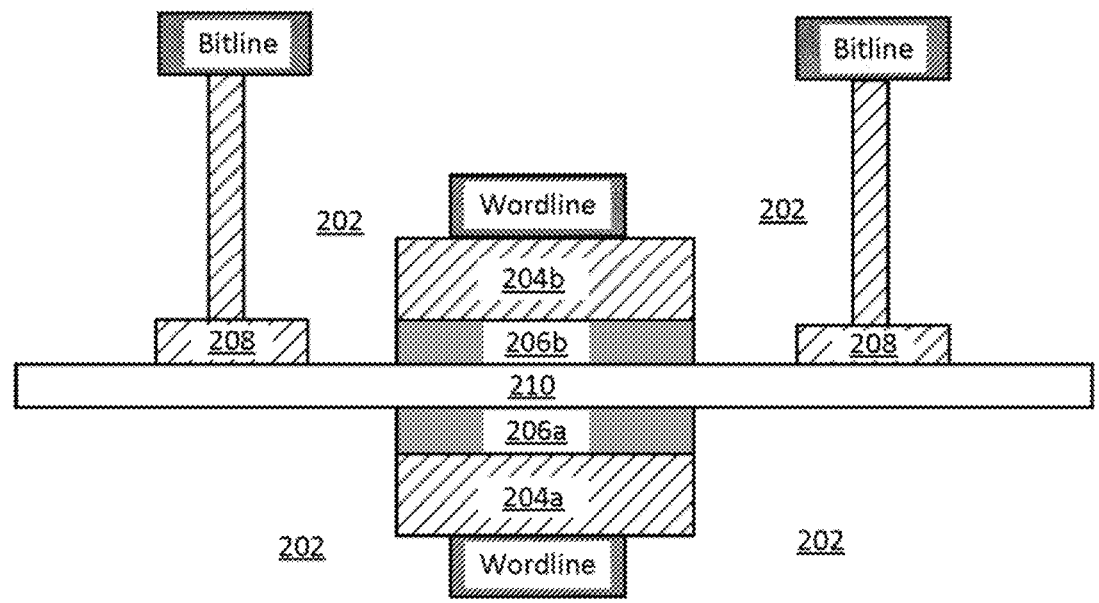

As will be understood, the disclosed back-end FE-FET structures may be attached to bitlines and wordlines as shown, for example, in FIG. 4A. FIG. 4A illustrates S/D metal features 208 contacting bitlines, however, in other embodiments, bitlines may directly contact semiconductor layer 210 and S/D metal feature 208 may not be included. While FIG. 4A illustrates a particular FE-FET configuration where the bitlines are under semiconductor layer 210, it is to be understood that various other FE-FET configurations may be produced. For example, FIG. 4B shows an example FE-FET configuration where both the bitlines are above semiconductor layer 210. As shown in FIG. 4B, vias may be used to position the bitlines as needed to avoid contacting other metal features, such as the wordline. As will be understood, wordlines of a FE-FET device may be electrically connected or not electrically connected, in some embodiments. In embodiments where the wordlines are independent (not electrically connected), two independent voltages can be applied to the gates of the FE-FET device. In embodiments where the wordlines are electrically connected, the wordlines can be electrically connected at any desired location, for example, at the periphery of the device or locally, in some embodiments. Numerous configurations and variations will be apparent.

In some particular embodiments, one or more additional FE-FET devices as described herein may be formed over an existing FE-FET device. As will be understood, an IC substrate 200 may be positioned at some layer below the structure depicted in FIG. 4A or the structure depicted in FIG. 4B. When a FE-FET device is positioned over another FE-FET device, the cell count density may be effectively doubled. In some embodiments, more than one FE-FET device (e.g., two, three, four, five, six, seven, eight, nine, ten, or more FE-FET devices) may be positioned over a FE-FET device to further increase cell density. When one or more FE-FET devices are stacked, each FE-FET device may have its own periphery that is specific to that FE-FET, or multiple FE-FETs may share the same sense amplifier, depending on the number of cells included in the bitline and the leakage of the cell in the unselected state.

In some embodiments, one or more other integrated circuit (IC) devices, such as various diodes (e.g., light-emitting diodes (LEDs) or laser diodes), various transistors (e.g., metal-oxide field-effect transistors (MOSFETs) or tunnel FETs (TFETs)), various microelectromechanical systems (MEMS), various nanoelectromechanical systems (NEMS), various sensors, or any other suitable semiconductor or IC devices, may also be formed on substrate 200, depending on the end use or target application. Accordingly, in some embodiments, FE-FET devices as described herein may be included in various system-on-chip (SoC) applications, as will be apparent in light of the present disclosure.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the components of the disclosed FE FET structures (e.g., FE-FET devices having a top gate, bottom gate and comprising material that exhibits ferroelectric properties at temperatures within the thermal budget of back-end processing).

Example System

Figure 5:
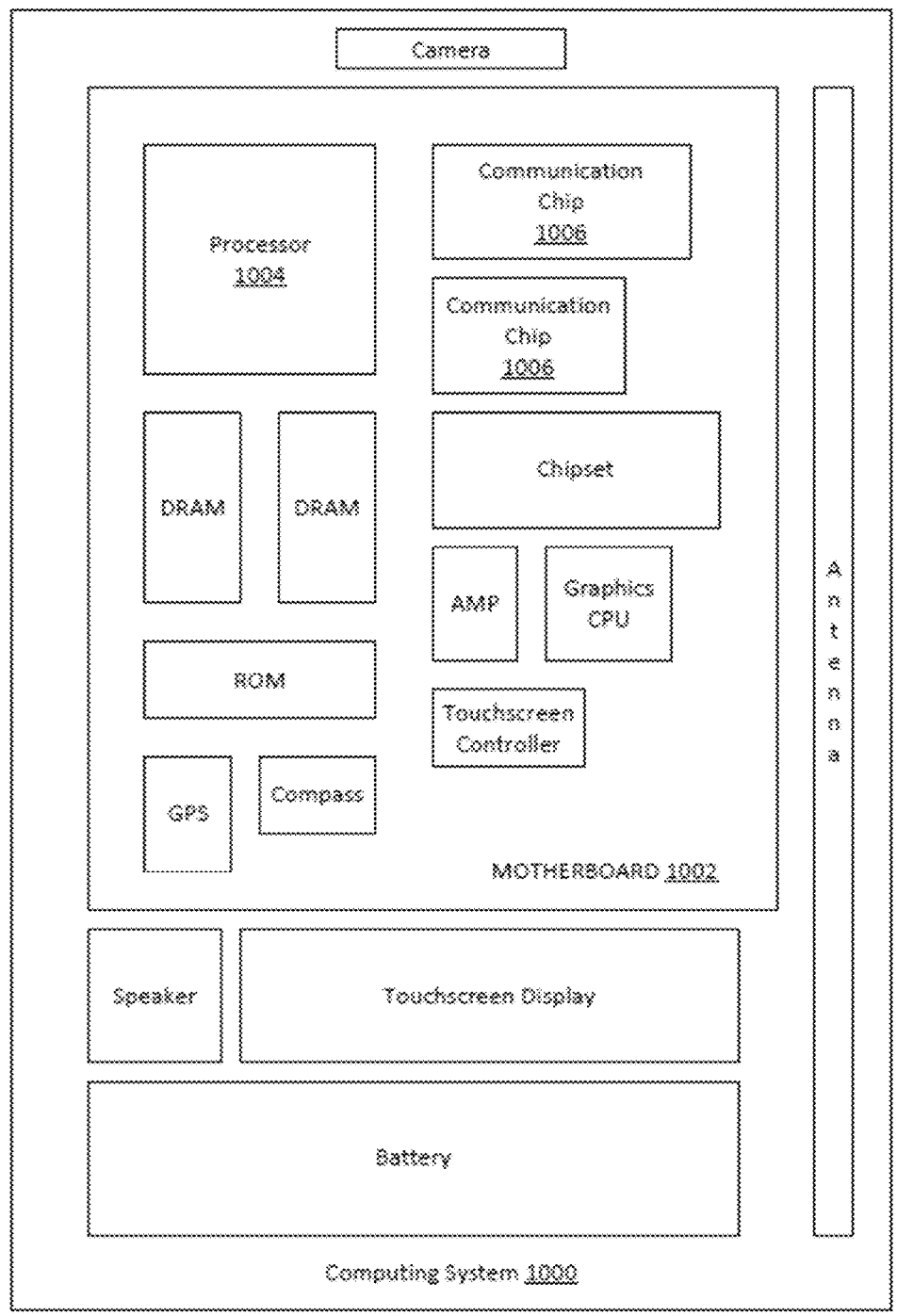
FIG. 5 illustrates an example computing system implemented with one or more integrated circuit structures or devices formed using the techniques disclosed herein, in accordance with various embodiments of the present disclosure.

FIG. 5 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., back-end FE-FETs) formed using the disclosed techniques, as variously described herein. The term "processor" may refer to any device or portion of a device that processes, for instance, electronic data from registers and/or memory to transform that electronic data into other electronic data that may be stored in registers and/or memory. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a ferroelectric field-effect transistor (FE-FET) device that includes a FE-FET semiconductor layer, a bottom gate electrode under the FE-FET semiconductor layer, a bottom ferroelectric layer between the bottom gate electrode and the FE-FET semiconductor layer, a top gate electrode above the FE-FET semiconductor layer and a top ferroelectric layer between the top gate electrode and the FE-FET semiconductor layer.

Example 2 includes the subject matter of Example 1, wherein the FE-FET semiconductor layer includes a material having a structure that is polycrystalline or amorphous.

Example 3 includes the subject matter of Example 2, wherein the FE-FET semiconductor layer is selected from the group consisting of: polycrystalline silicon, amorphous silicon, indium gallium zinc oxide (IGZO), group III-V materials and indium tin oxide (ITO), a complex oxide, and transition metal dichalcogenides.

Example 4 includes the subject matter of any of Examples 1-3, wherein the top ferroelectric layer and the bottom ferroelectric layer are implemented with the same material.

Example 5 includes the subject matter of any of Examples 1-4, wherein the top ferroelectric layer and the bottom ferroelectric layer are implemented with different materials.

Example 6 includes the subject matter of Example 5, wherein the top ferroelectric layer and the bottom ferroelectric layer are implemented with materials having a polarization voltage difference of at least 50%.

Example 7 includes the subject matter of Example 6, wherein top ferroelectric layer and the bottom ferroelectric layer are implemented with materials having a polarization voltage difference of at least 100%.

Example 8 includes the subject matter of any of Examples 1-7, wherein the top ferroelectric layer has a thickness between the top gate electrode and the FE-FET semiconductor layer that is within 5 nm of a thickness of the bottom ferroelectric layer between the bottom gate electrode and the FE-FET semiconductor layer.

Example 9 includes the subject matter of any of Examples 1-8, wherein the top ferroelectric layer has a thickness between the top gate electrode and the FE-FET semiconductor layer that is at least 5 nm greater than or less than a thickness of the bottom ferroelectric layer between the bottom gate electrode and the FE-FET semiconductor layer.

Example 10 includes the subject matter of any of Examples 1-9, wherein the top gate electrode and the bottom gate electrode are implemented with the same material.

Example 11 includes the subject matter of any of Examples 1-10, wherein the top gate electrode includes a material having a work function and the bottom gate electrode includes a material having a work function and the work function of the top gate electrode material is within 1.0 eV of the work function of the bottom gate electrode material.

Example 12 includes the subject matter of any of Examples 1-11, wherein the top gate electrode includes a material having a work function and the bottom gate electrode includes a material having a work function and the work function of the top gate electrode material is at least 1.0 eV greater than or less than the work function of the bottom gate electrode material.

Example 13 includes the subject matter of Example 12, wherein the work function of the top gate electrode material is at least 2.0 eV greater than or less than the work function of the bottom gate electrode material.

Example 14 includes the subject matter of any of Examples 1-13 and further includes bitlines above or below the FE-FET semiconductor layer.

Example 15 includes the subject matter of any of Examples 1-14 and further includes a top wordline contacting the top gate electrode and a bottom wordline contacting the bottom gate electrode, wherein the top wordline and the bottom wordline are either electrically connected or not electrically connected.

Example 16 is an integrated circuit device that includes a semiconductor substrate, a device layer over the semiconductor substrate and including one or more metal oxide semiconductor (MOS) logic transistors and a ferroelectric field-effect transistor (FE-FET) device above the device layer, the FE-FET device including a FE-FET semiconductor layer, a bottom gate electrode under the FE-FET semiconductor layer, a bottom ferroelectric layer between the bottom gate electrode and the FE-FET semiconductor layer, a top gate electrode above the FE-FET semiconductor layer and a top ferroelectric layer between the top gate electrode and the FE-FET semiconductor layer.

Example 17 includes the subject matter of Example 16, wherein the FE-FET semiconductor layer includes a material having a structure that is polycrystalline or amorphous.

Example 18 includes the subject matter of Example 17, wherein the FE-FET semiconductor layer is selected from the group consisting of: polycrystalline silicon, amorphous silicon, indium gallium zinc oxide (IGZO), group III-V materials and indium tin oxide (ITO), a complex oxide, and transition metal dichalcogenides.

Example 19 includes the subject matter of any of Examples 16-18, wherein the top ferroelectric layer and the bottom ferroelectric layer are implemented with the same material.

Example 20 includes the subject matter of any of Examples 16-19, wherein the top ferroelectric layer and the bottom ferroelectric layer are implemented with different materials.

Example 21 includes the subject matter of Example 18, wherein the top ferroelectric layer and the bottom ferroelectric layer are implemented with materials having a polarization voltage difference of at least 50%.

Example 22 includes the subject matter of Example 21, wherein the top ferroelectric layer and the bottom ferroelectric layer are implemented with materials having a polarization voltage difference of at least 100%.

Example 23 includes the subject matter of any of Examples 16-22, wherein the top ferroelectric layer has a thickness between the top gate electrode and the FE-FET semiconductor layer that is within 5 nm of a thickness of the bottom ferroelectric layer between the bottom gate electrode and the FE-FET semiconductor layer.

Example 24 includes the subject matter of any of Examples 16-23, wherein the top ferroelectric layer has a thickness between the top gate electrode and the FE-FET semiconductor layer that is at least 5 nm greater than or less than a thickness of the bottom ferroelectric layer between the bottom gate electrode and the FE-FET semiconductor layer.

Example 25 includes the subject matter of any of Examples 16-24, wherein the top gate electrode and the bottom gate electrode are implemented with the same material.

Example 26 includes the subject matter of any of Examples 16-25, wherein the top gate electrode includes a material having a work function and the bottom gate electrode includes a material having a work function and the work function of the top gate electrode material is within 1.0 eV of the work function of the bottom gate electrode material.

Example 27 includes the subject matter of any of Examples 16-26, wherein the top gate electrode includes a material having a work function and the bottom gate electrode includes a material having a work function and the work function of the top gate electrode material is at least 1.0 eV greater than or less than the work function of the bottom gate electrode material.

Example 28 includes the subject matter of Example 27, wherein the work function of the top gate electrode material is at least 2.0 eV greater than or less than the work function of the bottom gate electrode material.

Example 29 includes the subject matter of any of Examples 16-28 and further includes an additional ferroelectric field-effect transistor (FE-FET) device including a ferroelectric layer positioned above the FE-FET device.

Example 30 is a system-on-chip (SoC) that includes the integrated circuit device of any of Examples 16-29.

Example 31 is a mobile computing system that includes the integrated circuit device of any of Examples 16-29 or the SoC of Example 30.

Example 32 is a method of producing a ferroelectric field-effect transistor (FE-FET) that includes forming a bottom gate, forming a bottom ferroelectric layer on the bottom gate, forming a semiconductor layer on the bottom ferroelectric layer, forming a top ferroelectric layer on the semiconductor layer and forming a top gate on the top ferroelectric layer.

Example 33 includes the subject matter of Example 32, wherein the semiconductor layer includes material having a structure that is polycrystalline or amorphous.

Example 34 includes the subject matter of Example 33, wherein the semiconductor layer is selected from the group consisting of: polycrystalline silicon, amorphous silicon, indium gallium zinc oxide (IGZO), group III-V materials and indium tin oxide (ITO), a complex oxide, and transition metal dichalcogenides.

Example 35 includes the subject matter of any of Examples 32-34, wherein the top ferroelectric layer and the bottom ferroelectric layer are implemented with the same material.

Example 36 includes the subject matter of any of Examples 32-35, wherein the top ferroelectric layer and the bottom ferroelectric layer are implemented with different materials.

Example 37 includes the subject matter of any of Examples 32-36, wherein the top ferroelectric layer and the bottom ferroelectric layer are implemented with materials having a polarization voltage difference of at least 50%.

Example 38 includes the subject matter of any of Examples 32-37, wherein the top ferroelectric layer has a thickness between the top gate and the FE-FET semiconductor layer that is within 5 nm of a thickness of the bottom ferroelectric layer between the bottom gate and the FE-FET semiconductor layer.

Example 39 includes the subject matter of any of Examples 32-38, wherein the top ferroelectric layer has a thickness between the top gate and the FE-FET semiconductor layer that is at least 5 nm greater than or less than a thickness of the bottom ferroelectric layer between the bottom gate and the FE-FET semiconductor layer.

Example 40 includes the subject matter of any of Examples 32-39, wherein the top gate and the bottom gate are implemented with the same material.

Example 41 includes the subject matter of any of Examples 32-40, wherein the top gate includes a material having a work function and the bottom gate includes a material having a work function and the work function of the top gate material is within 1.0 eV of the work function of the bottom gate material.

Example 42 includes the subject matter of any of Examples 32-41, wherein the top gate includes a material having a work function and the bottom gate includes a material having a work function and the work function of the top gate material is at least 1.0 eV greater than or less than the work function of the bottom gate material.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure comprising:
   a first layer comprising semiconductor material;
   a first gate electrode under the first layer;
   a second layer comprising first ferroelectric material between the first gate electrode and the first layer;
   a second gate electrode above the first layer; and
   a third layer comprising second ferroelectric material between the second gate electrode and the first layer,
   wherein the first ferroelectric material of the second layer and the second ferroelectric material of the third layer have a polarization voltage difference of at least 50%.

2. The integrated circuit structure of claim 1, wherein the semiconductor material of the first layer has a structure that is polycrystalline or amorphous.

3. The integrated circuit structure of claim 2, wherein the semiconductor material of the first layer is selected from a group consisting of: polycrystalline silicon, amorphous silicon, indium gallium zinc oxide (IGZO), polycrystalline group III-V materials, indium tin oxide (ITO), a complex oxide, and transition metal dichalcogenides.

4. The integrated circuit structure of claim 1, wherein the first ferroelectric material of the second layer and the second ferroelectric material of the third layer comprise the same material.

5. The integrated circuit structure of claim 1, wherein the first ferroelectric material of the second layer and the second ferroelectric material of the third layer comprise different materials.

6. The integrated circuit structure of claim 1, wherein the first ferroelectric material of the second layer and the second ferroelectric material of the third layer have a polarization voltage difference of at least 100%.

7. The integrated circuit structure of claim 1, wherein the third layer has a thickness between the second gate electrode and the first layer that is at least 5 nm greater than or less than a thickness of the second layer between the first gate electrode and the first layer.

8. The integrated circuit structure of claim 1, wherein the first gate electrode and the second gate electrode comprise the same material.

9. The integrated circuit structure of claim 1, wherein the first gate electrode includes a first material having a first work function, and the second gate electrode includes a second material having a second work function, and the second work function of the second gate electrode material is at least 2.0 eV greater than or less than the first work function of the first gate electrode material.

10. The integrated circuit structure of claim 1 further comprising bitlines above and/or below the first layer.

11. The integrated circuit structure of claim 1 further comprising a first wordline contacting the first gate electrode, and a second wordline contacting the second gate electrode.

12. An integrated circuit, comprising:
a device layer including one or more metal oxide semiconductor (MOS) logic transistors; and
a ferroelectric field-effect transistor (FE-FET) device above the device layer, the FE-FET device including
a first layer,
a first gate electrode above the first layer;
a second layer comprising first ferroelectric material between the first gate electrode and the first layer;
a second gate electrode below the first layer; and
a third layer comprising second ferroelectric material between the second gate electrode and the first layer,
wherein the second layer has a thickness between the first gate electrode and the first layer that is at least 5 nm greater than or less than a thickness of the third layer between the second gate electrode and the first layer.

13. The integrated circuit of claim 12, wherein the first ferroelectric material of the second layer and the second ferroelectric material of the third layer comprise the same material, and wherein the semiconductor material of the first layer has a structure that is polycrystalline or amorphous.

14. The integrated circuit of claim 12, wherein the first ferroelectric material of the second layer and the second ferroelectric material of the third layer comprise different material.

15. The integrated circuit of claim 12,
wherein the first ferroelectric material of the second layer and the second ferroelectric material of the third layer have a polarization voltage difference of at least 50%.

16. The integrated circuit of claim 12, wherein the first gate electrode includes a first material having a first work function, and the second gate electrode includes a second material having a second work function, and the second work function of the second gate electrode material is at least 2.0 eV greater than or less than the first work function of the first gate electrode material.

17. The integrated circuit of claim 12, wherein the first ferroelectric material of the second layer and the second ferroelectric material of the third layer have a polarization voltage difference of at least 100%.

18. An integrated circuit, comprising:
a device layer including one or more metal oxide semiconductor (MOS) logic transistors; and
a ferroelectric field-effect transistor (FE-FET) device above the device layer, the FE-FET device including
a first layer including polycrystalline silicon, amorphous silicon, indium gallium zinc oxide (IGZO), a polycrystalline group III-V material, indium tin oxide (ITO), a complex oxide, and/or a transition metal dichalcogenide,
a first gate electrode above the first layer;
a second layer comprising ferroelectric material between the first gate electrode and the first layer;
a second gate electrode under the first layer;
a third layer comprising ferroelectric material between the second gate electrode and the first layer; and
a first source or drain (S/D) metal feature coupled to a first bit line, and a second source or drain (S/D) metal feature coupled to a second bit line,
wherein the first layer has (i) a top surface facing the first gate electrode and the second layer, and (ii) a bottom surface facing the second gate electrode and the third layer,
wherein both the first S/D metal feature and the second S/D metal feature are coupled to only one of the top surface or the bottom surface of the first layer.

19. The integrated circuit of claim 18, wherein another of the top surface or the bottom surface of the first layer does not have any S/D metal features or bitlines coupled thereto.

20. The integrated circuit of claim 18, wherein at least one of:
the ferroelectric material of the second layer comprises different material than the ferroelectric material of the second layer; and/or
the ferroelectric material of the second layer and the ferroelectric material of the third layer have a polarization voltage difference of at least 50%.

* * * * *